US006791742B2

(12) United States Patent
Staker et al.

(10) Patent No.: US 6,791,742 B2
(45) Date of Patent: Sep. 14, 2004

(54) MEMS STRUCTURE WITH RAISED ELECTRODES

(75) Inventors: Bryan P. Staker, Pleasanton, CA (US); Lawrence P. Muray, Moraga, CA (US); Andres Fernandez, Dublin, CA (US)

(73) Assignee: Glimmerglass Networks, Inc., Hayward, CA (US)

( * ) Notice: Subject to any disclaimer, the term of this patent is extended or adjusted under 35 U.S.C. 154(b) by 0 days.

(21) Appl. No.: 10/700,734

(22) Filed: Nov. 3, 2003

(65) Prior Publication Data

US 2004/0095629 A1 May 20, 2004

Related U.S. Application Data

(63) Continuation-in-part of application No. 09/919,219, filed on Jul. 30, 2001, now Pat. No. 6,693,735.

(51) Int. Cl.[7] ............................................. G02B 26/00
(52) U.S. Cl. ..................... 359/291; 359/290; 359/292; 359/293; 359/295
(58) Field of Search ............................... 359/290–295, 359/224, 214, 198, 199, 230, 237, 848, 850; 257/414, 415, 417, 418

(56) References Cited

U.S. PATENT DOCUMENTS

| 5,396,364 A | 3/1995 | O'Meara et al. |
|---|---|---|
| 5,944,717 A | 8/1999 | Lee et al. |
| 5,991,066 A | 11/1999 | Robinson et al. |
| 6,034,810 A | 3/2000 | Robinson et al. |
| 6,040,611 A * | 3/2000 | De Los Santos et al. ... 257/415 |
| 6,291,266 B1 | 9/2001 | Sayyah |
| 6,449,406 B1 | 9/2002 | Fan et al. |
| 2002/0101769 A1 | 8/2002 | Gaverick et al. |

* cited by examiner

Primary Examiner—Hung Xuan Dang
Assistant Examiner—Joseph Martinez
(74) Attorney, Agent, or Firm—Townsend and Townsend and Crew LLP; Kenneth R. Allen

(57) ABSTRACT

In an electrostatically controlled deflection apparatus, such as a MEMS array having cavities formed around electrodes and which is mounted directly on a dielectric or controllably resistive substrate in which are embedded electrostatic actuation electrodes disposed in alignment with the individual MEMS elements, a mechanism is provided to mitigate the effects of uncontrolled dielectric surface potentials between the MEMS elements and the electrostatic actuation electrodes, the mechanism being raised electrodes relative to the dielectric or controllably resistive surface of the substrate. The aspect ratio of the gaps between elements (element height to element separation ratio) is at least 0.1 and preferably at least 0.5 and preferably between 0.75 and 2.0 with a typical choice of about 1.0, assuming a surface fill factor of 50% or greater. Higher aspect ratios at these fill factors are believed not to provide more than marginal improvement.

7 Claims, 3 Drawing Sheets

MEMS STRUCTURE WITH RAISED ELECTRODES

CROSS-REFERENCES TO RELATED APPLICATIONS

This application is a continuation in part application of patent application Ser. No. 09/919,219 filed Jul. 30, 2001, now U.S. Pat. No. 6,693,735 entitled MEMS STRUCTURE WITH SURFACE POTENTIAL CONTROL. It is closely related to but represents an improvement over patent application Ser. No. 09/919,569 filed Jul. 20, 2001, now U.S. Pat. No. 6,635,158, entitled ELECTRO CERAMIC MEMS STRUCTURE WITH CONTROLLED ACTUATOR GAP.

STATEMENT AS TO RIGHTS TO INVENTIONS MADE UNDER FEDERALLY SPONSORED RESEARCH OR DEVELOPMENT

NOT APPLICABLE

BACKGROUND OF THE INVENTION

This invention relates to electro ceramic components and structures that accurately control surface potentials around electro ceramic components. Components constructed according to the invention can be Micro Electro Mechanical System (MEMS) devices, MEMS arrays, or other micromachined elements.

Conventional MEMS array structures comprise Silicon on Insulator (SOI) array structures associated with an electrode array disposed to interact with the MEMS actuatable elements. Electrostatic MEMS structures develop forces and torques between the actuatable elements and their corresponding electrodes. Conventional MEMS structures separate conductive surfaces with dielectrics. These dielectrics contribute to the mechanical operation of the device because accumulated charge distributions on their surfaces contribute to the electrostatic force and/or torque on the MEMS actuatable elements. One of the problems encountered is control of the surface potentials between the electrodes and control of the surface potentials on the insulators. Surface potentials on dielectric surfaces are prone to drift over time due to charge migration along dielectric surfaces between said electrodes. This can cause serious problems regarding repeatability of positioning. An issue that arises is that the potential of these surfaces is not controlled due to non-linear conduction across the surfaces of ions and charges that accumulate in an uncontrolled fashion. The conduction characteristics of these surfaces are inherently unstable due to sensitivity to temperature, moisture and other environmental factors. They can also be affected by electromagnetic radiation (light), which can be time dependent depending on the application, contributing to system crosstalk. The conductivity of these surfaces is also strongly affected by impurities and process steps and materials used in the deposition and etching of the surfaces. All of these factors combined contribute to a loss of control of the surface potentials that contribute to the forces and torques applied to the actuatable elements resulting in an unreliable and uncontrollable device.

What is needed is a solution that mitigates the effects of uncontrolled dielectric surface potentials so that the electrostatic forces and torques are determined solely by the voltages applied to the electrodes.

SUMMARY OF THE INVENTION

According to the invention, in an electrostatically controlled deflection apparatus, such as a MEMS array having cavities formed around electrodes and which is mounted directly on a dielectric or controllably resistive substrate in which are embedded electrostatic actuation electrodes disposed in alignment with the individual MEMS elements, a mechanism is provided to mitigate the effects of uncontrolled dielectric surface potentials between the MEMS elements and the electrostatic actuation electrodes, the mechanism being raised electrodes relative to the dielectric or controllably resistive surface of the substrate. The aspect ratio of the gaps between elements (element height to element separation ratio) is at least 0.1 and preferably at least 0.5 and preferably between 0.75 and 2.0 with a typical choice of about 1.0, assuming a surface fill factor of 50% or greater. Higher aspect ratios at these fill factors provide incremental marginal improvement.

In a specific embodiment, the substrate has electrode elements having a height of at least 15 microns for a separation between elements and between elements and side walls of no more than 150 microns, where the surface fill factor is at least 50%.

In a further specific and preferred embodiment, the substrate has electrode elements having a height of at least 150 microns for a separation between elements and between elements and side walls of no more than 150 microns, where the fill factor is approximately 75%. It has already been discovered that the saturated drift impacting tilt angle of actuatable MEMS elements is controllable to better than 150 microradians, or better than about one part in 500 over all possible input voltages up to a breakdown voltage of nearly 600 volts.

In a further specific embodiment, the potential on the dielectric surfaces on the substrate is controlled using a highly-resistive coating so that the surface potential between adjacent electrodes and between the electrodes and the actuatable element is determined by small but stable leakage currents between electrodes of different potentials. The leakage current is limited by material characteristics so that power dissipation levels and crosstalk between electrodes are mitigated, yet it permits enough current to flow to create stable, repeatable and temperature-independent and humidity-independent potential gradients along the surfaces to allow for highly accurate deflection of the MEMS actuatable elements.

In another embodiment, the entire dielectric substrate is allowed to be slightly conductive, that is, conductive with high resistivity. The surface potentials between electrodes are controlled without necessitating an additional deposition.

The invention will be better understood by reference to the following detailed description in connection with the accompanying illustrations.

DETAILED DESCRIPTION OF THE INVENTION

Figure 1:
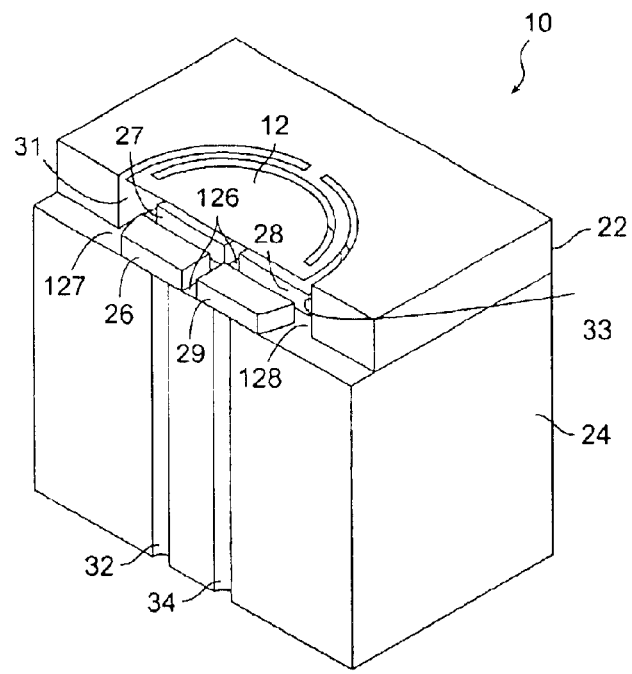
FIG. 1 is a perspective view in cutaway of a representative embodiment according to the invention.
Figure 2:
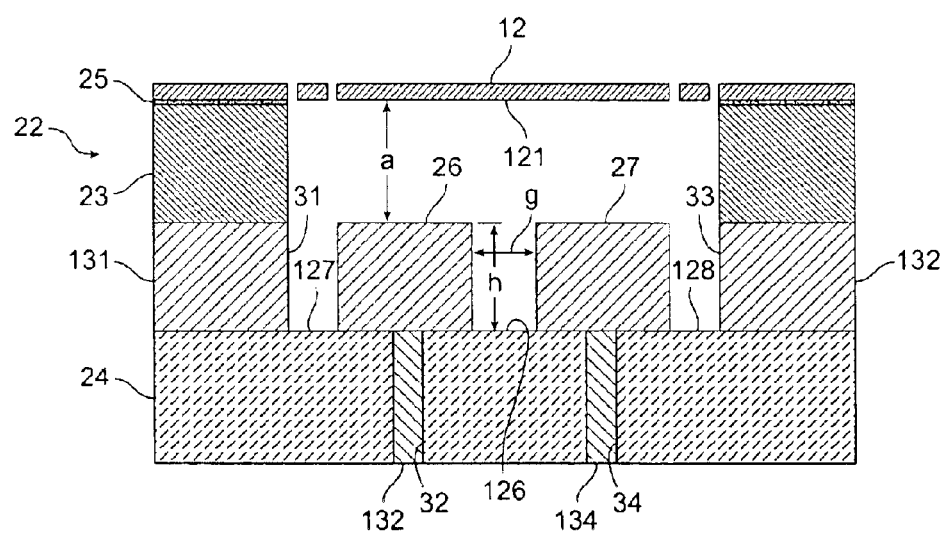
FIG. 2 is a side cross-sectional view of a single array element according to a first embodiment of the invention showing raised electrodes with a handle mounted to a frame at the same height as raised electrodes.

Reference is made to FIG. 1 in which is shown a single MEMS (Micro Electro-Mechanical Systems) array element 10 according to the invention, with a MEMS-based mirror 12 fabricated in an integrated Silicon on Insulator (SOI) structure (a MEMS structure) 22 and mounted on a substrate or base 24, which is typically electrically insulative. According to the invention, and referring also to FIG. 2, a mechanism is provided whereby the effects of uncontrolled surface potentials are mitigated through use of raised electrodes 26–29 and optionally highly resistive interstitial regions 126 between the several electrodes 26–29 and interstitial regions 127, 128 between the raised electrodes 26–29 and surrounding conductive sidewalls or surfaces 31 and 33. The electrodes 26–29 are connected to voltage sources (not shown) through vias 32, 34, etc. containing a conductive material, such as a metal 132, 134. The structure of element 10 shown in FIG. 1 is not specific to a particular configuration. Various materials, layouts of electrodes and mirror or actuatable elements may be used without departing from the scope of the invention. Selected details of specific configurations are illustrated by FIGS. 2–6. The structure may be for example a conductive silicon plate 22 mounted to an insulative ceramic base 24, silicon plate 22 to polyimide materials base 24, silicon plate 22 to circuit board base 24, silicon plate 22 to silicon base 24, silicon plate 22 to thick film on any substrate material as the base 24, or silicon plate 22 to thin film on any substrate material as the base 24. The method of joining is not limited by this invention, as for example to techniques of bonding, gluing, welding, riveting, pinning, or the like.

Raised electrodes 26–29 are mounted directly on the substrate 24 and are energized to actuate the mirror 12 through electrostatic force. Charges residing on dielectric surfaces 126–128 associated with the actuation can create an undesired perturbation in the surface potential relative to the areas surrounding the electrodes 26, 27. By providing that the electrodes 26, 27 are raised relative to the dielectric surfaces 126–128 so that the aspect ratio of the gaps (at 126–128) between elements (27, 28) as well as with the walls 31, 33 (where aspect ratio is the ratio of element height "h" to element separation or gap "g") is at least 0.1 and preferably at least 0.5 and preferably between 0.75 and 2.0 with a typical choice of about 1.0, assuming a surface fill factor of 50% or greater, the effects of uncontrollable distributed potential and accumulation of charge are mitigated, since the electrodes 26, 27 and the walls 31, 33 provide effective shielding between the confronting surface 121 of the mirror 12 structure and the exposed dielectric surfaces 126–128. Higher aspect ratios at these surface fill factors are believed not to provide more than marginal improvement.

Referring again to FIG. 2, where the aspect ratio is exaggerated for emphasis, there is shown a preferred embodiment of a structure having raised electrodes 26,27 in accordance with the invention. The substrate 24 is insulative ceramic, the plate 22 is conductive, such as a doped silicon block 23 on an arbitrarily thin insulative layer 25 (oxide). The plate 22 also called a handle is mounted on the electrode layer on side walls 131, 132. When assembled, the gap "a" is established solely by the thickness of the plate 22.

Figure 3:
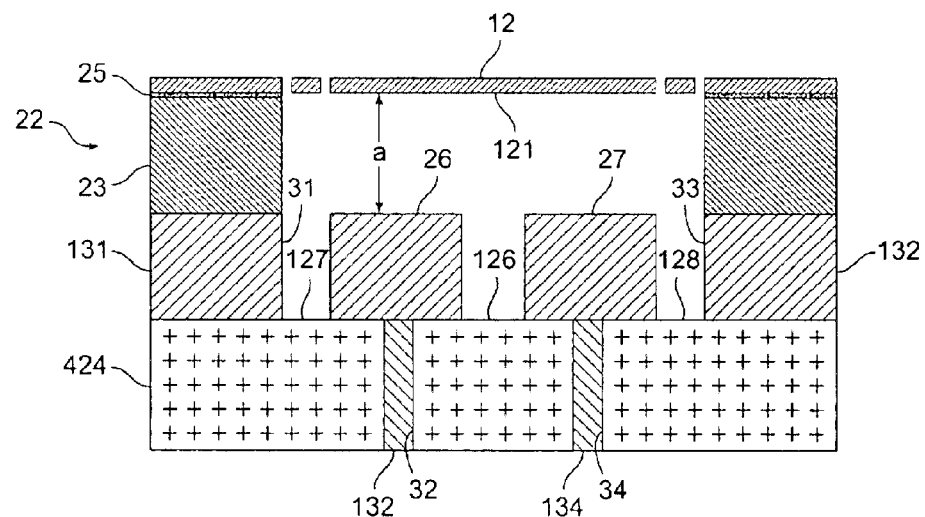
FIG. 3 is a side cross-sectional view of a single array element according to a third embodiment of the invention showing raised electrodes similar to FIG. 2 wherein the substrate supporting the raised electrodes is of highly resistive material.

Referring to FIG. 3, there is shown a further form of surface potential control in accordance with the invention. The form factor is identical to that of FIG. 2, so the explanation of certain common aspects of the structure are not repeated. The substrate 424 is of a modestly conductive or so-called resistive, rather than insulative, ceramic, and the plate 22 is conductive or semiconductive, such as a doped silicon block 23 on an insulative layer 25 (oxide). In this structural configuration, the ceramic base 424 has a bulk resistivity of 10,000,000 to 1,000,000,000 ohm-cm in a typical geometry and thickness, providing a surface resistivity between electrodes 26, 27, etc., and relative to adjacent wall structures 131, 132 of the cavity, of about 1,000,000,000 ohms per square. The resultant operational characteristic is within the intended range according to the invention, as the resistivity characteristics help control of surface potential.

Figure 4:
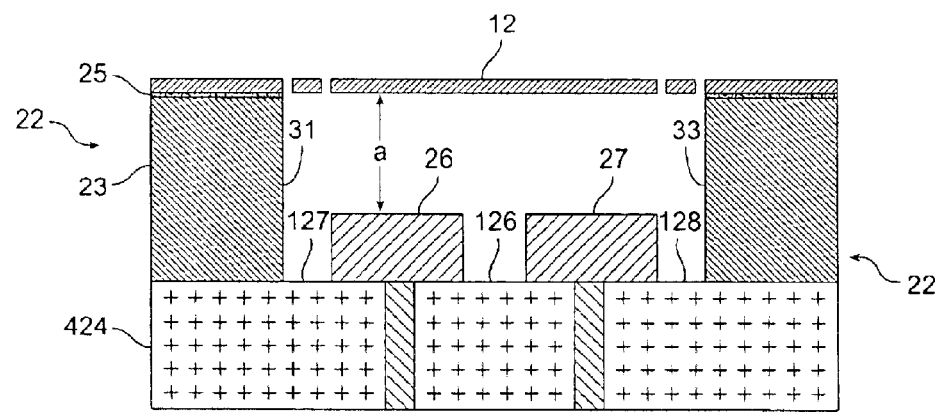
FIG. 4 is a side cross-sectional view of a single array element according to a fourth embodiment of the invention showing raised electrodes similar to FIG. 3 wherein the substrate supporting the raised electrodes is of highly resistive material.

Referring to FIG. 4, there is shown a further form of surface potential control in accordance with the invention. The form factor is nearly identical to that of FIG. 3, so the explanation of certain common aspects of the structure are not repeated. In this embodiment the silicon block 23 is attached to the substrate 424 so that the height of the gap "a" is established by the difference between the height of the silicon block and the height of the electrodes.

Figure 5:
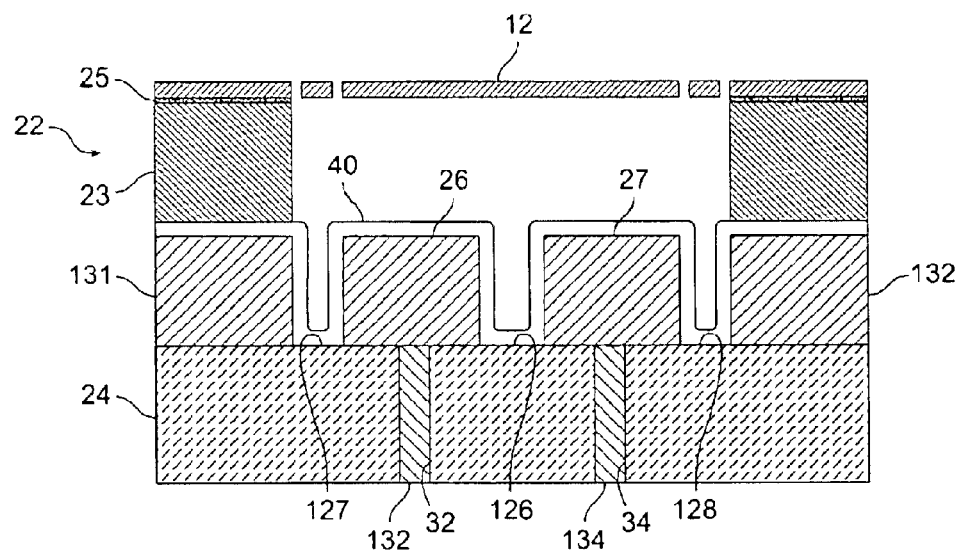
FIG. 5 is a side cross-sectional view of a single array element according to a fifth embodiment of the invention showing raised electrodes similar to FIG. 2 wherein the substrate and the electrodes are coated with a highly resistive layer of material.

Referring to FIG. 5, there is shown a further structure in accordance with the invention. It is similar in structure to that of the embodiment of FIG. 2, so explanation of common features are not repeated. In this structure, electrodes 26, 27, etc., are spaced at a preselected distance from the actuatable element 12 as established by the height of the block 23, which rests on the layer of the electrodes 131, 132. In accordance with the invention, a coating of highly resistive material 40 is disposed between the silicon block 23 and the electrode layer 131, 132 and ceramic base 24, extending across the surface of the base 24 and over the electrodes 26, 27, etc., including the regions 126–128 between the electrodes 26, 27. The resistive material is for example chromium oxide, tin oxide, indium tin oxide, carbon, titanium boride, chromium boride, molybdenum silicide, tungsten silicide or titanium nitride, all of which have an inherently high but finite resistivity. In a preferred embodiment, the bulk resistivity is in the range of about 100,000 to 10,000,000 ohm-cm, providing a surface resistivity of about 1,000,000,000 ohms per square (in a typical geometry and thickness). This characteristic is sufficient to control potential in regions adjacent the electrodes, but resistance is not so low as to interfere with the operation of the electrodes in response to applied voltage.

Figure 6:
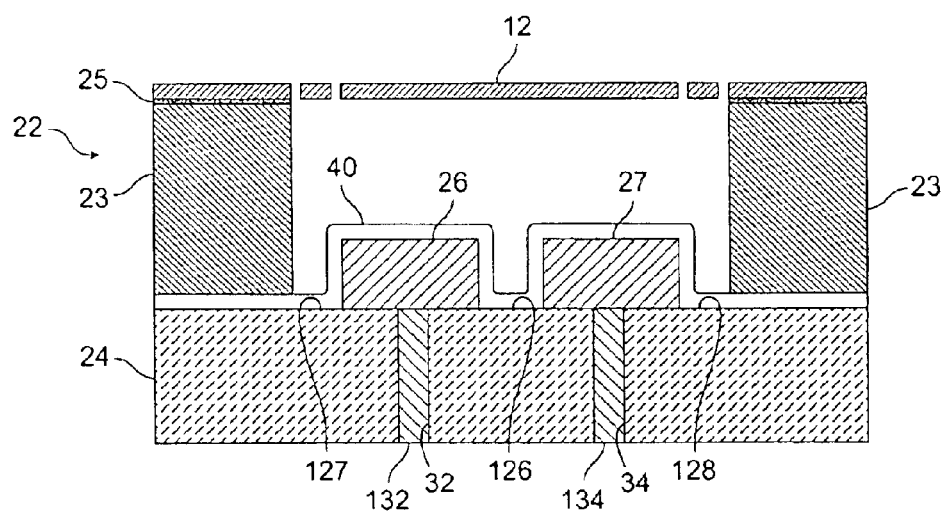
FIG. 6 is a side cross-sectional view of a single array element according to a fifth embodiment of the invention showing raised electrodes similar to FIG. 3 wherein the substrate and the electrodes are coated with a highly resistive layer of material.

Referring to FIG. 6, there is shown a still further structure in accordance with the invention. It is similar in structure to that of the embodiment of FIG. 5, so explanation of common features are not repeated. In this structure, electrodes 26, 27, etc., are spaced at a preselected distance from the actuatable element 12 as established by the height of the block 23 resting on the ceramic base 24, as in the embodiment of FIG. 4. In accordance with the invention, a coating of highly resistive material 40 is disposed between the silicon block 23 and the ceramic base 24, extending across the surface of the base 24 and over the electrodes 26, 27, etc., including the regions 126–128 between the electrodes 26, 27. The resistance is sufficient to control potential in regions adjacent electrodes, but resistance is not so low as to interfere with the operation of the electrodes in response to applied voltage. The gap is to be noted.

The invention has been explained with reference to specific embodiments. Other embodiments will be evident to those of ordinary skill in the art. Therefore, it is not intended that this invention be limited, except as indicated by the appended claims.

What is claimed is:

1. An electrostatically controlled apparatus having an actuatable element over a cavity and electrodes in said cavity electrodes for actuating said actuatable element, the improvement wherein:

said electrodes are raised on a substrate, the ratio of height of the electrodes to spacing between the electrodes being at least one to ten in order to establish a controlled potential among the actuatable elements and the electrostatic actuation electrodes.

2. The apparatus according to claim 1 wherein at least a surface of selected high resistivity is provided in spaces between the electrodes.

3. The apparatus according to claim 1, wherein a first coating of selected high resistivity is provided at least in spaces between the electrodes.

4. The apparatus according to claim 1, wherein a deposition of a high-resistivity material is provided everywhere over the electrodes and adjacent spaces.

5. The apparatus according to claim 1, wherein a dielectric substrate is slightly conductive with high resistivity so that surface potentials between electrodes are controlled without necessitating additional deposition.

6. The apparatus according to claim 1, wherein height of electrodes and side surfaces of side walls are at a common level and wherein actuator support is upon said side walls so that actuator height above said electrodes is determined only by said actuator support.

7. The apparatus according to claim 1, wherein the ratio of height of the electrodes to spacing between the electrodes is between 0.75 and 2.0 to 1.

* * * * *